(12) United States Patent
Chang (10) Patent No.: US 9,263,293 B2
(45) Date of Patent: Feb. 16, 2016

(54) FLASH MEMORY STRUCTURE AND METHOD FOR FORMING THE SAME

(71) Applicant: TAIWAN SEMICONDUCTOR MANUFACTURING CO., LTD., Hsin-Chu (TW)

(72) Inventor: Yu-Ling Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/152,162

(22) Filed: Jan. 10, 2014

(65) Prior Publication Data
US 2015/0200292 A1 Jul. 16, 2015

(51) Int. Cl.
| | |
|---|---|
| H01L 29/76 | (2006.01) |
| H01L 21/311 | (2006.01) |
| H01L 21/28 | (2006.01) |
| H01L 21/3213 | (2006.01) |
| H01L 21/3205 | (2006.01) |
| H01L 29/66 | (2006.01) |
| H01L 29/423 | (2006.01) |
| H01L 29/788 | (2006.01) |
| H01L 27/115 | (2006.01) |

(52) U.S. Cl.
CPC .... *H01L 21/31111* (2013.01); *H01L 21/28273* (2013.01); *H01L 21/32055* (2013.01); *H01L 21/32135* (2013.01); *H01L 21/32139* (2013.01); *H01L 27/11521* (2013.01); *H01L 29/4234* (2013.01); *H01L 29/66825* (2013.01); *H01L 29/7881* (2013.01)

(58) Field of Classification Search
CPC ............. H01L 27/1156; H01L 29/42324; H01L 29/42328; H01L 29/42332
USPC .................................... 257/314–320
See application file for complete search history.

(56) References Cited

U.S. PATENT DOCUMENTS

| 6,108,239 A * | 8/2000 | Sekariapuram et al. . 365/185.28 |
| 6,187,636 B1* | 2/2001 | Jeong ............................ 438/267 |
| 6,525,371 B2* | 2/2003 | Johnson et al. ................ 257/317 |
| 2004/0016955 A1* | 1/2004 | Chuang et al. ................ 257/314 |

* cited by examiner

*Primary Examiner* — Tan N Tran
(74) *Attorney, Agent, or Firm* — Birch, Stewart, Kolasch & Birch, LLP (57) ABSTRACT

Embodiments of mechanisms of a semiconductor structure are provided. The semiconductor device structure includes a substrate and a floating gate having a first sidewall and a second sidewall formed over the substrate. The semiconductor device further includes an insulating layer formed over the substrate to cover the first sidewall and an upper portion of the second sidewall of the floating gate. The semiconductor device further includes a control gate formed over the insulating layer. In addition, the floating gate is formed in a shark's fin shape.

16 Claims, 13 Drawing Sheets

FLASH MEMORY STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

A flash memory cell has elements such as gate, spacers, and source and drain regions. However, controlling and shrinking the size of those elements in a flash memory cell are still challenging.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
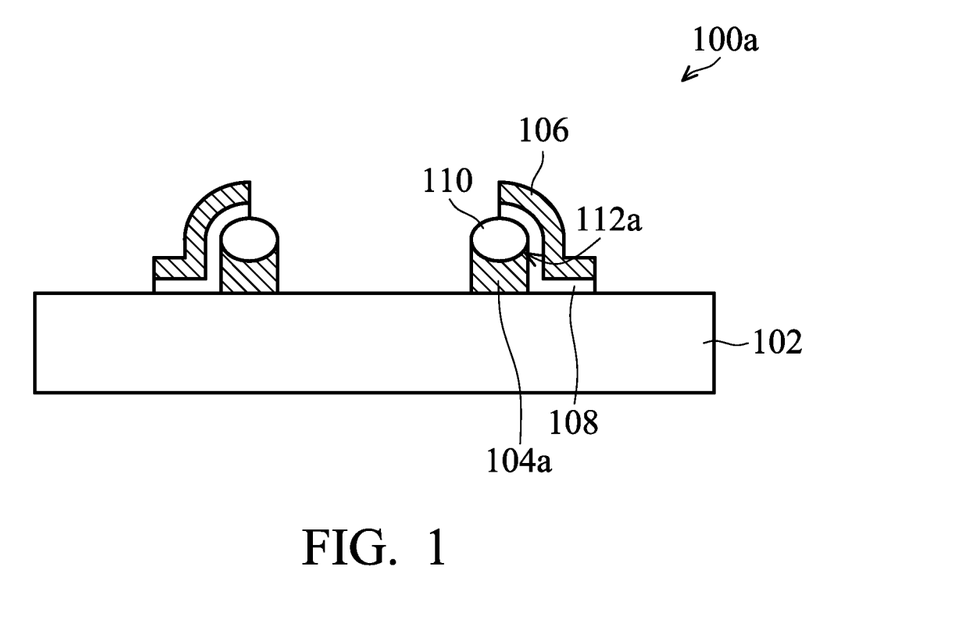
FIG. 1 illustrates a cross-sectional representation of a flash memory structure in accordance with some embodiments.

Mechanisms for a semiconductor structure are provided in accordance with some embodiments of the disclosure. In some embodiments, the semiconductor structure is a flash memory structure. FIG. 1 illustrates a cross-sectional representation of a flash memory structure 100a in accordance with some embodiments. Flash memory structure 100a includes a floating gate 104a and a control gate 106 formed over a substrate 102, as shown in FIG. 1 in accordance with some embodiments. An insulating layer 108 is formed between floating gate 104a and control gate 106 to separate floating gate 104a and control gate 106. A poly-oxide structure 110 is formed over floating gate 104a, such that floating gate 104a can have a tip structure 112a.

More specifically, poly-oxide structure 110 is formed by performing an oxidation process to an upper portion of a polysilicon structure at a high temperature. After the oxidation process, the oxidized upper portion forms poly-oxide structure 110, and the un-oxidized bottom portion forms floating gate 104a. Therefore, tip structure 112a of floating gate 104a is defined by poly-oxide structure 110, and electric charges can be transferred from floating gate 104a to control gate 106 through tip structure 112a.

However, the profile of tip structure 112a is difficult to control. In some embodiments, the size of poly-oxide structure 110 formed by the oxidation process is too large, such that floating gate 104a formed below poly-oxide structure 110 becomes fragile, or even broken. In some embodiments, the oxidation process is performed for such a long time that the whole polysilicon structure is oxidized and no floating gate is left below poly-oxide structure 110. In some embodiments, the original size of the polysilicon structure is too thin (or too small) to be oxidized, and therefore poly-oxide structure 110 is not formed and floating gate 104a does not have tip structure 112a.

Furthermore, the oxidation process used to form poly-oxide structure 110 is performed under high temperature. Therefore, elements formed in/on substrate 102 may be damaged during the oxidation process.

Accordingly, in some embodiments, a flash memory structure is formed without using the oxidation process described above. That is, a floating gate with a tip structure may be formed without forming poly-oxide structure 110 thereon. FIGS. 2A to 2L illustrate cross-sectional representations of various stages of forming a flash memory structure 100b without forming poly-oxide structure 110 shown in FIG. 1 in accordance with some embodiments.

Figure 2A:
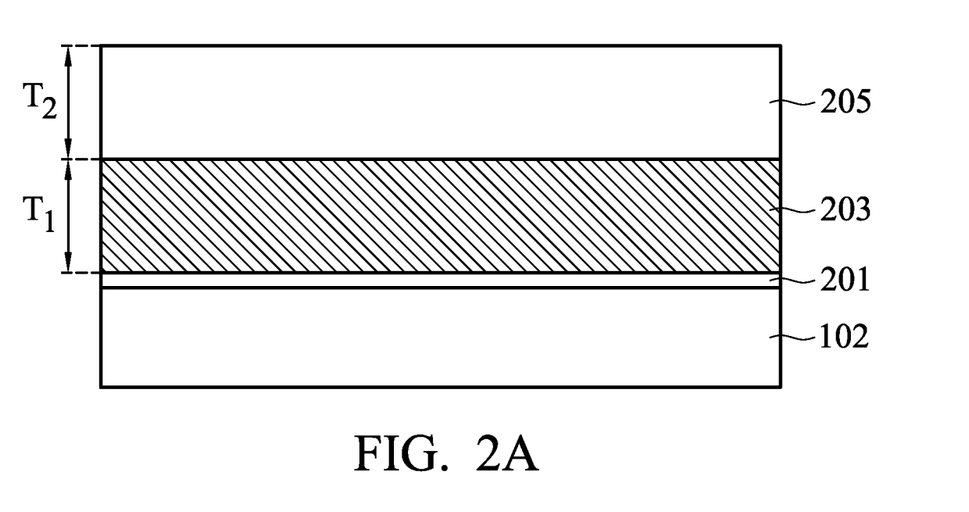
FIGS. 2A to 2L illustrate cross-sectional representations of various stages of forming a flash memory structure without forming the poly-oxide structure shown in FIG. 1 in accordance with some embodiments.

Referring to FIG. 2A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, substrate 102 includes structures such as doped regions, isolation features, interlayer dielectric (ILD) layers, and/or conductive features. In addition, substrate 102 may further include single or multip structurele material layers to be patterned. For example, the material layers may include a silicon layer, a dielectric layer, and/or a doped polysilicon layer.

A first dielectric layer 201 is formed over substrate 102 in accordance with some embodiments. In some embodiments, first dielectric layer 201 includes high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, and hafnium dioxide-alumina ($HfO_2$—$Al_2O_3$) alloy. In some embodiments, first dielectric layer 201 is formed by chemical vapor deposition (CVD), physical vapor deposition (PVD), atomic layer deposition (ALD), high density plasma CVD (HDPCVD), metal organic CVD (MOCVD), plasma enhanced CVD (PECVD), or a thermal process such as a furnace deposition.

A first polysilicon layer 203 is formed over first dielectric layer 201 in accordance with some embodiments. First polysilicon layer 203 may be formed by a depositing process. In some embodiments, first polysilicon layer 203 is deposited by furnace deposition, CVD, PVD, ALD, HDPCVD, MOCVD, or PECVD. In some embodiments, first polysilicon layer 203 has a thickness $T_1$ in a range from about 500 A to about 3000 A.

After first polysilicon layer 203 is formed, a second dielectric layer, such as an oxide layer 205, is formed over first polysilicon layer 203 in accordance with some embodiments. Oxide layer 205 may be formed by CVD, or other applicable deposition processes. In some embodiments, oxide layer 205 has a thickness $T_2$ in a range from about 500 A to about 3000 A. In some embodiments, thickness $T_2$ of oxide layer 205 is no greater than thickness $T_1$ of first polysilicon layer 203.

Figure 2B:
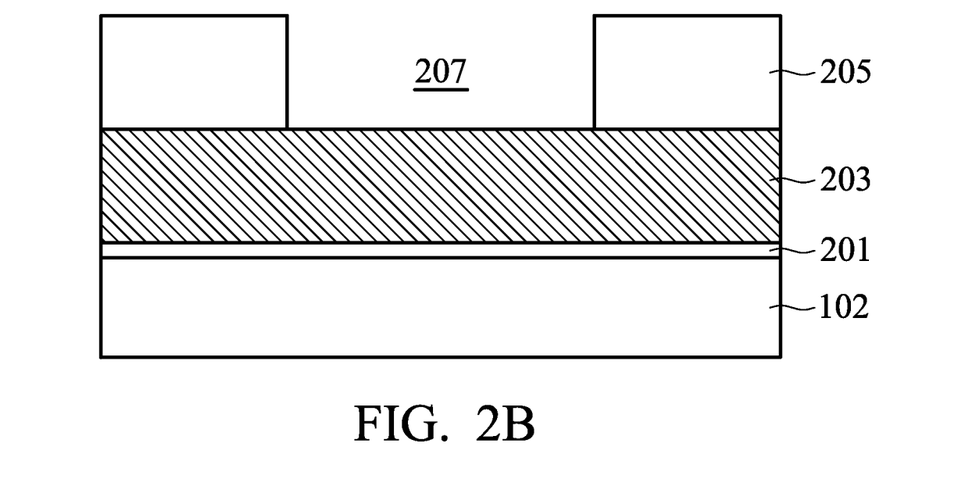

Next, an opening 207 is formed in oxide layer 205, as shown in FIG. 2B in accordance with some embodiments. Opening 207 may be formed by forming a patterned photoresist layer over oxide layer 205 and etching oxide layer 205 though the patterned photoresist layer. Oxide layer 205 may be etched by a dry etching process.

Figure 2C:
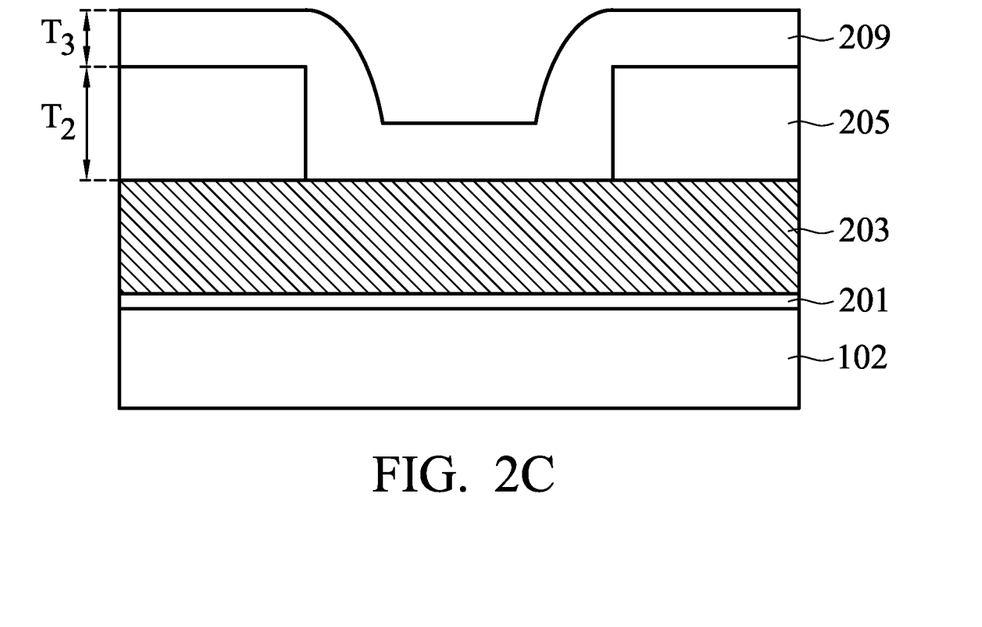

After opening 207 is formed, a third dielectric layer, such as a nitride layer 209, is conformally formed over oxide layer 205, as shown in FIG. 2C in accordance with some embodiments. In addition, nitride layer 209 is formed on the sidewalls of opening 207. Nitride layer 209 may be alternatively formed by a CVD process, although other applicable deposition processes may also be used. In some embodiments, nitride layer 209 has a thickness $T_3$ in a range from about 500 A to about 6000 A.

In some embodiments, thickness $T_2$ of oxide layer 205 is greater than thickness $T_3$ of nitride layer 209. For example, the ratio of thickness $T_2$ of oxide layer 205 to thickness $T_3$ of nitride layer 209 is in a range from about 2 to about 1. It should be noted that in some other embodiments, thickness $T_2$ may be substantially equal to, or less than thickness $T_3$, and the details of these embodiments will be described later.

Figure 2D:
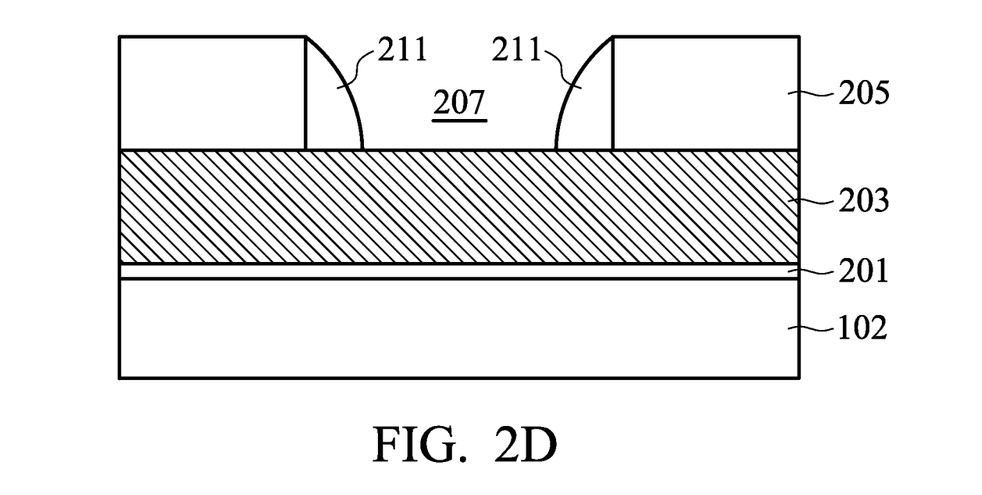
Figure 2E:
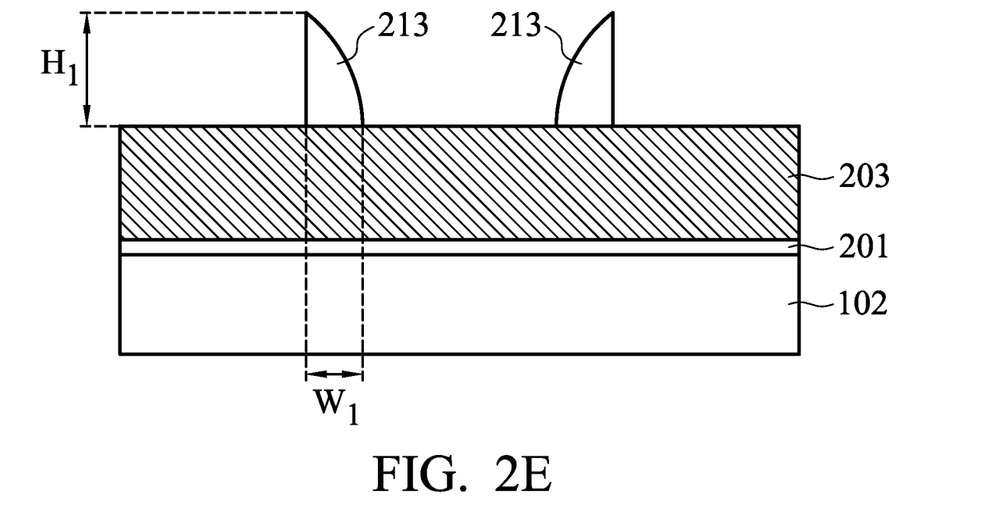

Afterwards, nitride layer 209 is etched to form spacers 211 on the sidewalls of opening 207, as shown in FIG. 2D in accordance with some embodiments. In some embodiments, nitride layer 209 is etched by a dry etching process. Next, oxide layer 205 is removed to form mask structures 213, as shown in FIG. 2E in accordance with some embodiments. In addition, each mask structure 213 is in a shark's fin shape in accordance with some embodiments.

In some embodiments, mask structure 213 has a height $H_1$ and a width $W_1$. In some embodiments, the ratio of height $H_1$ to width $W_1$ is substantially equal to the ratio of thickness $T_2$ of oxide layer 205 to thickness $T_3$ of nitride layer 209. Therefore, the shape of mask structures 213 may be controlled by adjusting the ratio of thickness $T_2$ to thickness $T_3$. In some embodiments, the ratio of height $H_1$ to width $W_1$ is in a range from about 0.5 to about 2.

Figure 2F:
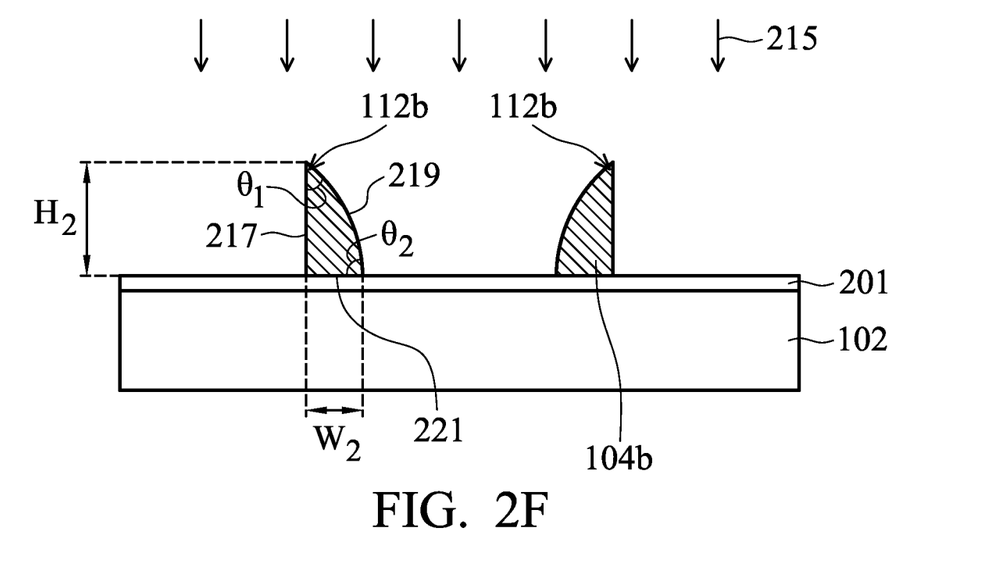

After mask structure 213 is formed, first polysilicon layer 203 is etched by an etching process 215 to form a floating gate 104b, as shown in FIG. 2F in accordance with some embodiments. Mask structure 213 is used as a mask during etching process 215. Therefore, the shape of floating gate 104b shown in FIG. 2F may be substantially the same as the shape of mask structure 213 shown in FIG. 2E.

In some embodiments, floating gate 104b has a height $H_2$ substantially equal to height $H_1$ of mask structure 213 and a width $W_2$ substantially equal to width $W_1$ of mask structure 213. In some embodiments, height $H_2$ of floating gate 104b is similar as $H_1$. In some embodiments, width $W_2$ of floating gate 104b is similar as $W_1$. In some embodiments, the ratio of height $H_2$ to width $W_2$ is similar as $H_1:W_1$.

In some embodiments, floating gate 104b also has the shape of a shark's fin. As shown in FIG. 2F, floating gate 104b has a first sidewall 217, a second sidewall 219, and a bottom surface 221, and a tip structure 112b has an angle $\theta_1$ formed between first sidewall 217 and a second sidewall 219. More specifically, tip structure 112b is at the top portion of floating gate 104b, and angle $\theta_1$ refers to the angle at the intersection of first sidewall 217 and second sidewall 219. In some embodiments, angle $\theta_1$ between first sidewall 217 and second sidewall 219 is in a range from about 30° to about 60°. In some embodiments, an angle $\theta_2$ between second sidewall 219 and bottom surface 221 is in a range from about 30° to about 60°.

Figure 2G:
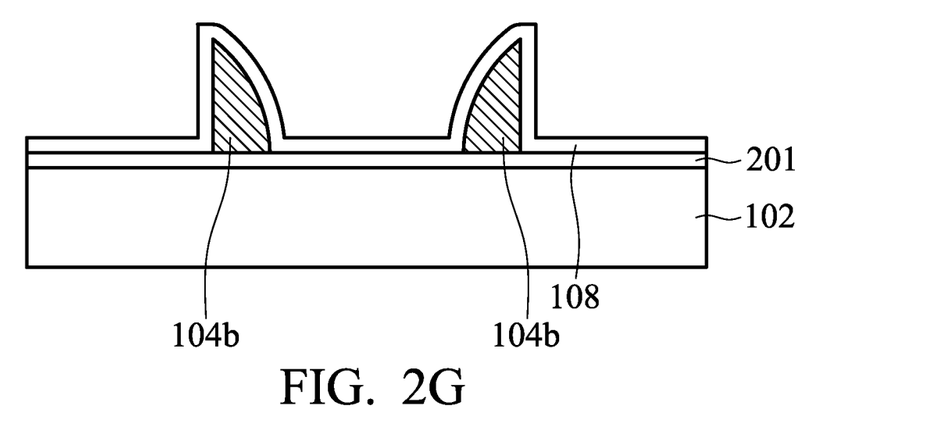

After floating gate 104b is formed, insulating layer 108 is formed over floating gates 104b and first dielectric layer 201, as shown in FIG. 2G in accordance with some embodiments. In addition, insulating layer 108 covers first sidewall 217 and second sidewall 219 of floating gate 104b. In some embodiments, insulating layer 108 is an oxide layer. Insulating layer 108 may be formed by a deposition process, such as a high temperature oxide (HTO) deposition process.

In some embodiments, insulating layer 108 has a thickness in a range from about 100 A to about 300 A. When insulating layer 108 is too thick, it may be difficult for electric charges to pass through insulating layer 108, and therefore, the erasing speed of flash memory structure 100b may decrease. However, when insulating layer 108 is too thin, electric charges may easily leak out of floating gates 104b.

Figure 2H:
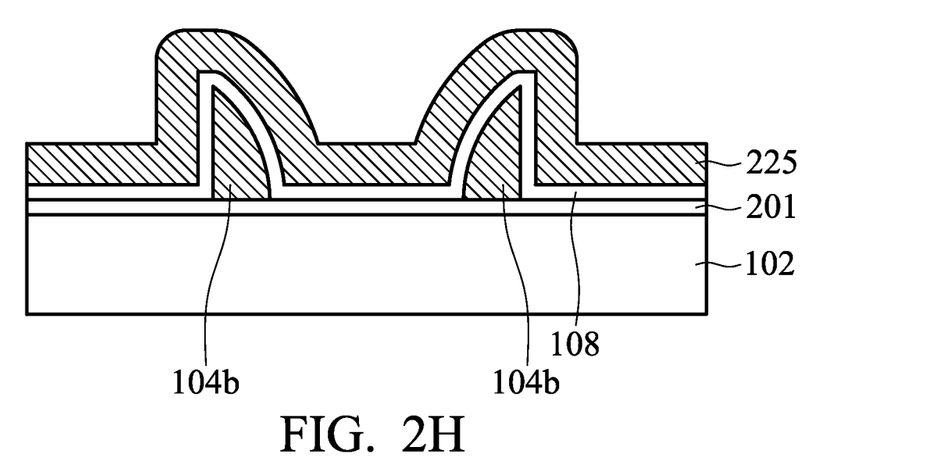

Next, a second polysilicon layer 225 is formed over insulating layer 108, as shown in FIG. 2H in accordance with some embodiments. Second polysilicon layer 225 may be formed by LPCVD, although other applicable deposition processes may alternatively be used. In some embodiments, the thickness of second polysilicon layer 225 is in a range from about 1000 A to about 3000 A.

Figure 2I:
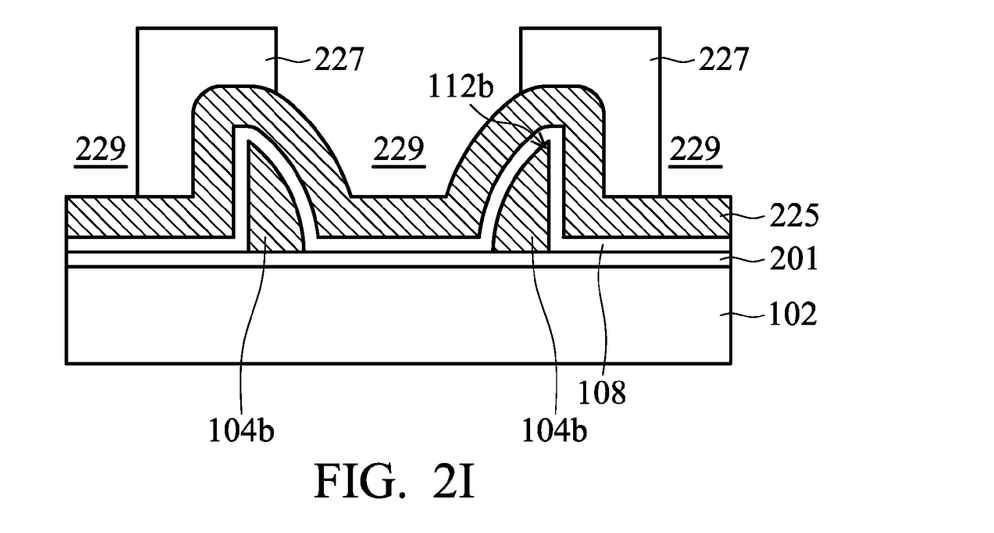

Afterwards, a photoresist layer 227 having photoresist openings 229 is formed over second polysilicon layer 225 in accordance with some embodiments. Photoresist layer 227 covers a portion of second polysilicon layer 225 over tip structure 112b of floating gate 104b and a portion of photoresist layer 227 formed beside floating gate 104b, as shown in FIG. 2I. Photoresist layer 227 is configured to protect second polysilicon layer 227 to form control gate 106 in the subsequent etching process.

Figure 2J:
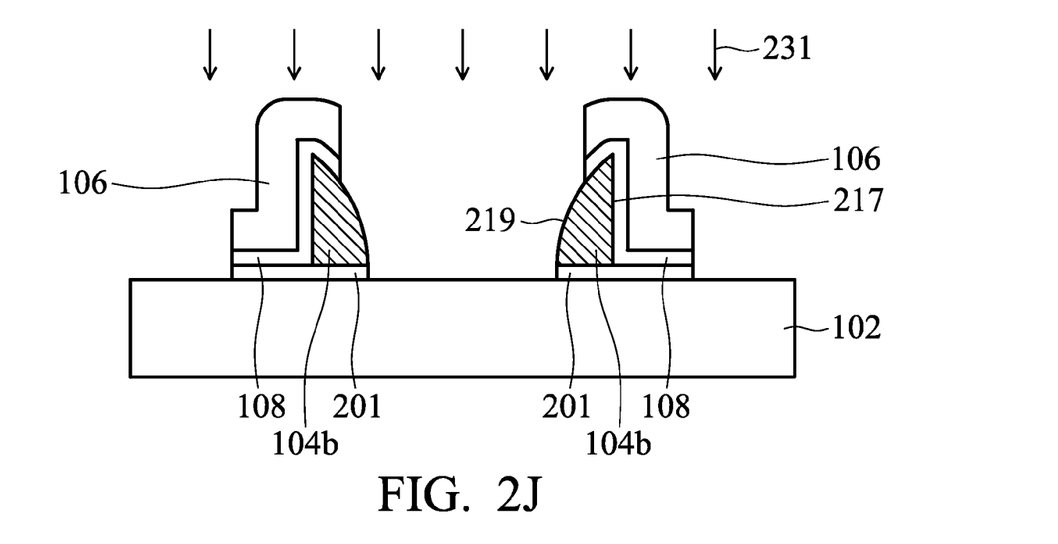

After photoresist layer 227 is formed, insulating layer 108 and second polysilicon layer 225 are pattered by an etching process 231, as shown in FIG. 2J in accordance with some embodiments. In some embodiments, etching process 231 is a dry etching process.

More specifically, etching process 231 is performed to etch insulating layer 108 and second polysilicon layer 225 through openings 229. After etching process 231 is performed, control gate 106 is formed, and a portion of control gate 106 overlaps with floating gate 104b. In addition, insulating layer 108 is formed between control gate 106 and floating gate 104b to separate control gate 106 and floating gate 104b. As shown in FIG. 2J, a bottom portion of second sidewall 219 of floating gate 104b is exposed, while first sidewall 219 and an upper portion of second sidewall 217 of floating gate 104b are covered by insulating layer 108 and control gate 106. In addition, insulating layer 108 is in direct contact with first sidewall 219 and the upper portion of second sidewall 217 of floating gate 104b.

Figure 2K:
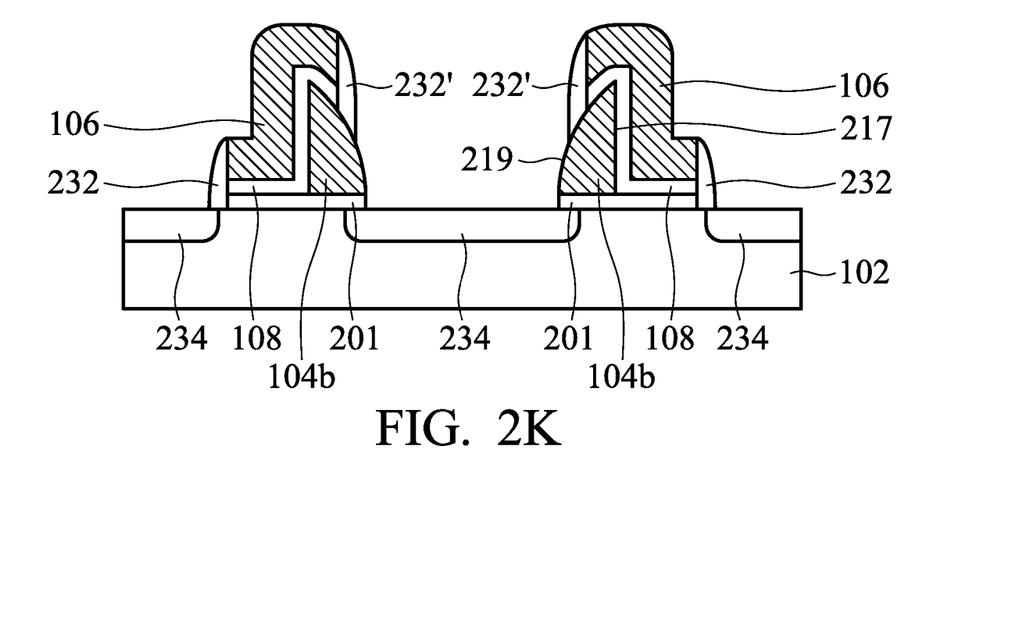

Next, a first spacer 232 is formed on a sidewall of control gate 106 on substrate 102, and a second spacer 232' is formed on another sidewall of control gate 106 on floating gate 104b, as shown in FIG. 2K in accordance with some embodiments. In some embodiments, second spacer 232' directly contacts second sidewall 219 of floating gate 104b. After first spacer 232 and second spacer 232' are formed, source and drain regions 234 are formed in substrate 102 in accordance with some embodiments.

Figure 2L:
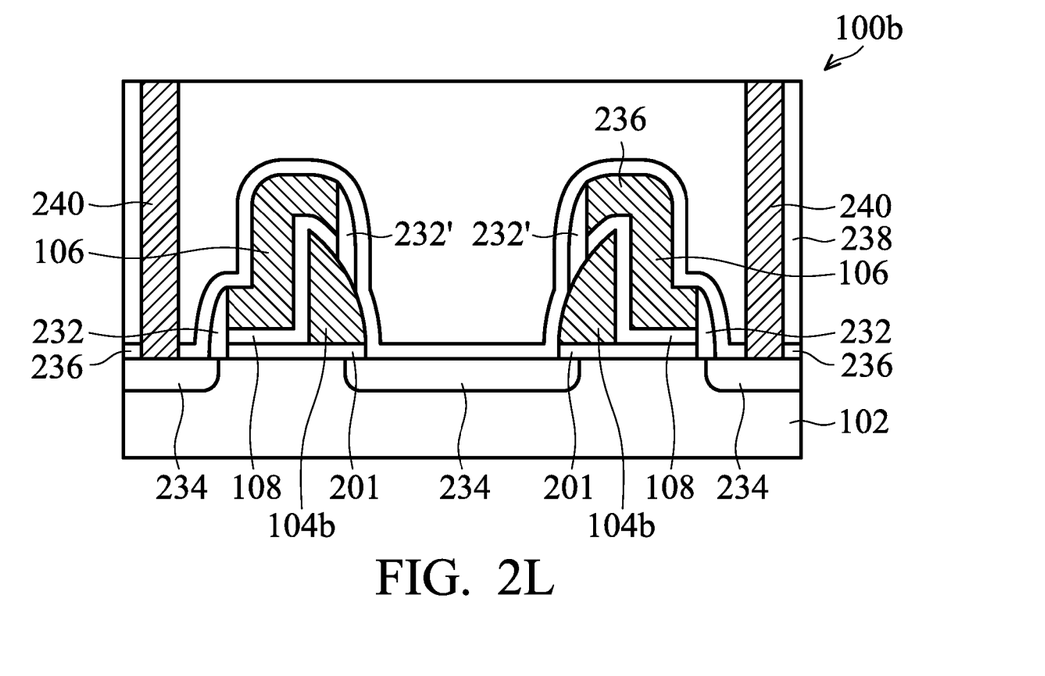

In some embodiments, a contact etch stop layer 236 is further formed to cover control gate 106 and floating gate 104b, as shown in FIG. 2L in accordance with some embodiments. In some embodiments, contact etch stop layer 236 is made of dielectric materials such as SiN or SiON. In some embodiments, contact etch stop layer 236 is formed by CVD.

After contact etch stop layer 236 is formed, an interlayer dielectric layer 238 is formed on contact etch stop layer 236 over substrate 102 in accordance with some embodiments. In some embodiments, interlayer dielectric layer 238 is an extremely low dielectric constant (ELK) interlayer dielectric layer. In some embodiments, interlayer dielectric layer 238 is made of fluorine-doped silicon dioxide, carbon-doped silicon dioxide, or other applicable dielectric materials. Interlayer dielectric layer 238 may be formed by CVD. It should be noted that interlayer dielectric layer 238 may be a single layer or may include multiple layers made of various materials, and the scope of the disclosure is not intended to be limiting.

Next, contacts 240 are formed through interlayer dielectric layer 238 to connect with source and drain regions 234, as shown in FIG. 2L in accordance with some embodiments. In some embodiments, contacts 240 include conductive materials such as W, Cu, Ta, Ti, TaN, or TiN. Contacts 240 may also include a barrier layer (not shown) on the sidewalls, and the barrier layer may be made of TaN, TiN, or CoW.

As described above, flash memory structure 100b, including floating gate 104b with tip structure 112b, is formed over substrate 102. Floating gate 104b has the shape of a shark's fin (e.g. a triangular floating gate). In addition, during the manufacturing processes, the shape of mask structure 213 can be controlled by thickness $T_2$ of oxide layer 205 and thickness $T_3$ of nitride layer 209. Moreover, the shape of floating gate 104b may be similar to, or the same as, the shape of mask structure 213. Therefore, the shape of floating gate 104b, especially the profile of tip structure 112b, can also be controlled by adjusting thickness $T_2$ and thickness $T_3$. For example, when thickness $T_2$ is greater than thickness $T_3$ (as shown in FIG. 2C), the resulting floating gates 104b may have a sharp tip structure 112b, as shown in FIG. 2F in accordance with some embodiments. When tip structure 112b is sharp, erasing ability of flash memory structure 100b is improved.

Figure 3A:
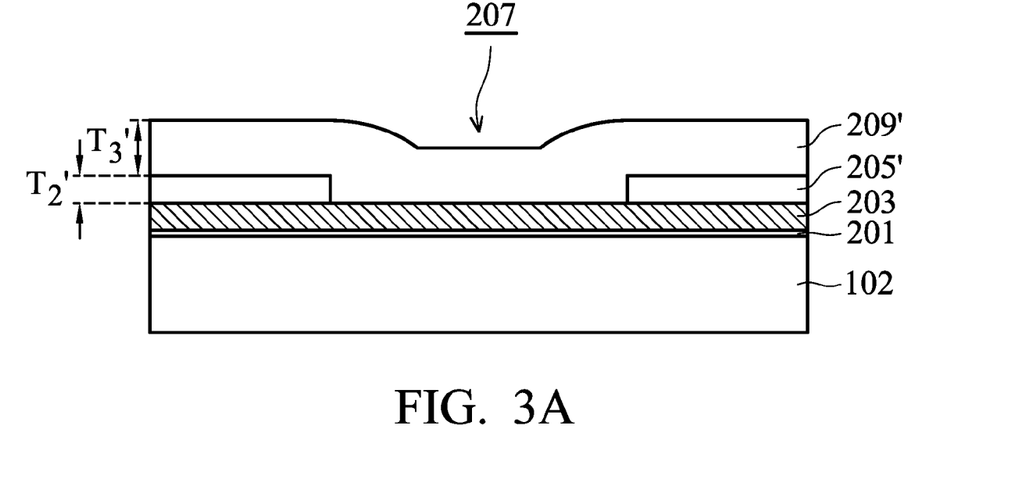
FIGS. 3A to 3E illustrate cross-sectional representations of various stages of forming a flash memory structure with a floating gate having a blunt tip structure in accordance with some embodiments.
Figure 3B:
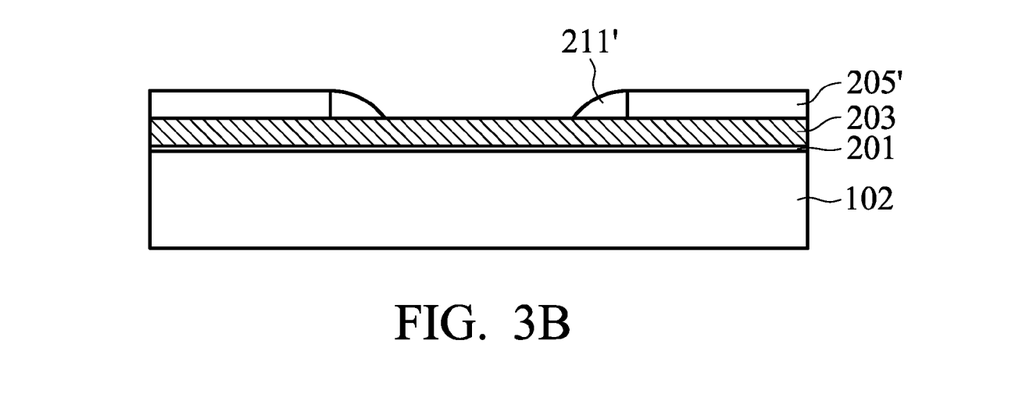
Figure 3C:
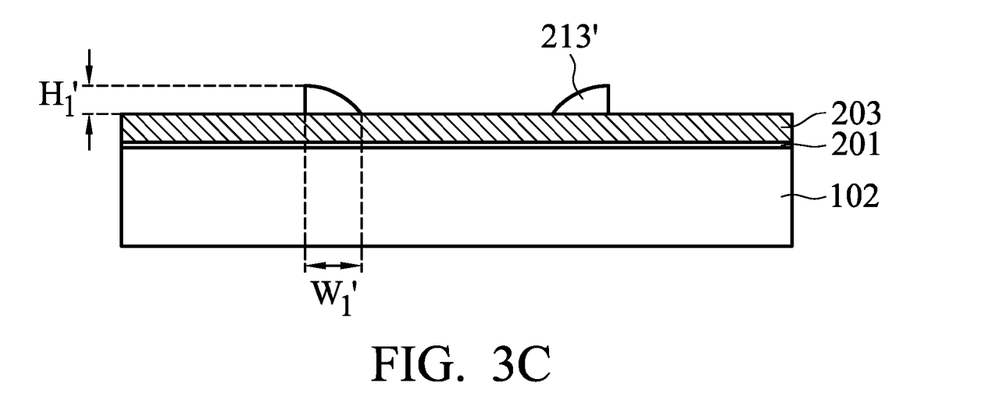
Figure 3D:
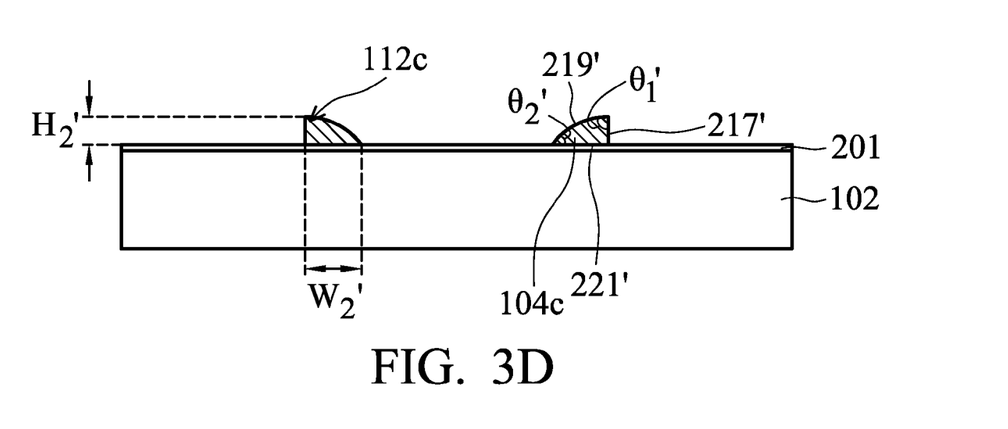
Figure 3E:
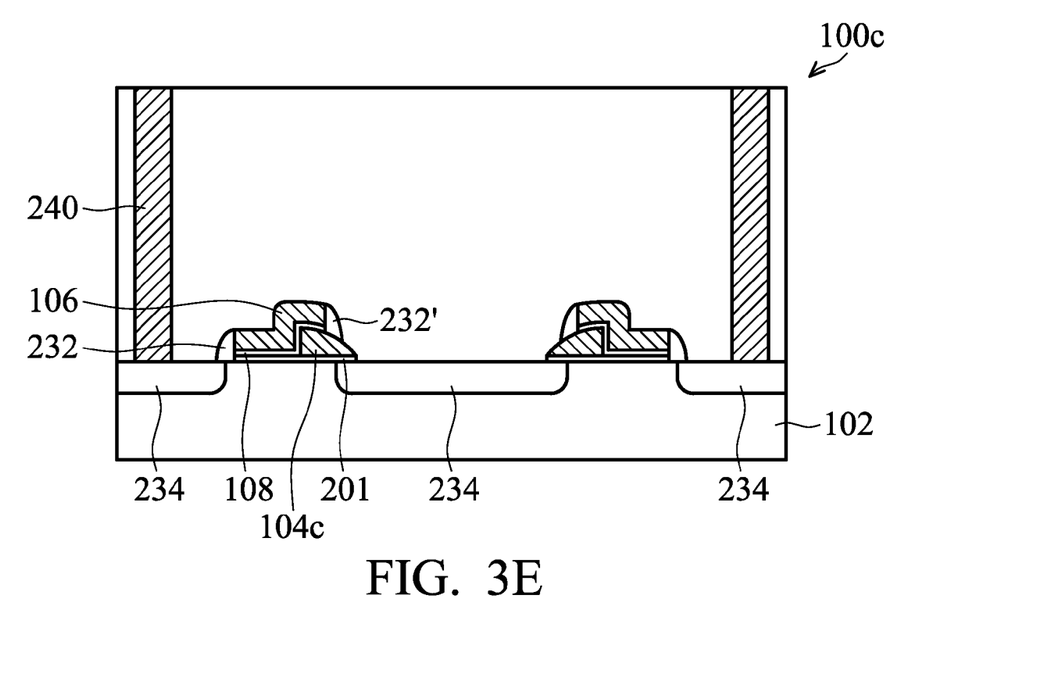

FIGS. 3A to 3E illustrate cross-sectional representations of various stages of forming a flash memory structure 100c with a floating gate 104c having a tip structure 112c in accordance with some embodiments. Structures shown in FIGS. 3A to 3E are similar to those in FIGS. 2C to 2L, except the thickness of an oxide layer 205' is less than the thickness of a nitride layer 209'. Therefore, flash memory structure 100c shown in FIG. 3E is similar to flash memory structure 100b shown in FIG. 2L, except tip structure 112c of floating gate 104c is not as sharp as tip structure 112b of floating gate 104b.

More specifically, oxide layer 205' having opening 207 is formed over first polysilicon layer 203, and nitride layer 209' is conformally formed over oxide layer 205', as shown in FIG. 3A in accordance with some embodiments. In addition, oxide layer 205' has a thickness $T_2'$, and nitride layer 209' has a thickness $T_3'$ greater than thickness $T_2'$. In some embodiments, the ratio of thickness $T_2'$ to thickness $T_3'$ is in a range from about 2 to about 1.

Afterwards, nitride layer 209' is etched to form spacers 211' on the sidewalls of opening 207, as shown in FIG. 3B in accordance with some embodiments. After spacers 211' are formed, oxide layer 205' is removed to form mask structures 213', as shown in FIG. 3C in accordance with some embodiments.

In some embodiments, mask structure 213' has a height $H_1'$ and a width $W_1'$. In some embodiments, the ratio of height $H_1'$ to width $W_1'$ is substantially equal to the ratio of thickness $T_2'$ of oxide layer 205' to thickness $T_3'$ of nitride layer 209'. Therefore, the shape of mask structures 213' is controlled by adjusting the ratio of thickness $T_2'$ to thickness $T_3'$. In some embodiments, the ratio of height $H_1'$ to width $W_1'$ is in a range from about 2 to about ½.

Afterwards, first polysilicon layer 203 is etched to form floating gate 104c, as shown in FIG. 3D in accordance with some embodiments. The shape of floating gate 104C shown in FIG. 3D may be substantially the same as the shape of mask structure 213' shown in FIG. 3C.

In some embodiments, floating gate 104c has a height $H_2'$ substantially equal to height $H_1'$ of mask structure 213' and a width $W_2'$ substantially equal to width $W_1'$ of mask structure 213'. In some embodiments, the ratio of height $H_2'$ to width $W_2'$ is similar as $H_1':W_1'$.

As shown in FIG. 3D, floating gate 104c also has the shape of a shark's fin, and tip structure 112c has an angle $\theta_1'$ formed between a first sidewall 217' and a second sidewall 219' of floating gate 104c. In some embodiments, angle $\theta_1'$ between first sidewall 217' and second sidewall 219' is in a range from about 30° to about 60°. In some embodiments, an angle $\theta_2'$ between second sidewall 219' and bottom surface 221' is in a range from about 30° to about 60°. As shown in FIG. 3D, by adjusting the thickness ratio of oxide layer 205' to nitride layer 209', tip structure 112c of floating gate 104c shown in FIG. 3D is not as sharp as tip structure 112b of floating gate 104b shown in FIG. 2F.

After floating gate 104c is formed, processes similar to those in FIGS. 2G to 2L may be performed to form flash memory structure 100c, as shown in FIG. 3E in accordance with some embodiments. Control gate 106 is formed over substrate 102 and a portion of control gate 106 overlaps with floating gate 104c. In addition, electric charges can be transferred from floating gate 104c to control gate 106 through tip structure 112c.

As described previously, the shape of mask structure 213' can be controlled by thickness $T_2$' of oxide layer 205' and thickness $T_3$' of nitride layer 209'. In addition, the shape of floating gate 104c may be similar to, or the same as, the shape of mask structure 213'. Therefore, when thickness $T_2$' is less than thickness $T_3$' (as shown in FIG. 3A), the resulting floating gates 104c may have a blunt tip structure 112c, compared to tip structure 112c shown in FIG. 2L. When tip structure 112c is relatively blunt, electric charges may tend to be retained in floating gate 104c even after various heating processes.

FIGS. 4A to 4E illustrate cross-sectional representations of various stages of forming a flash memory structure 100d with a floating gate 104d having a tip structure 112d in accordance with some embodiments. Structures shown in FIGS. 4A to 4E are similar to those in FIGS. 3A to 3E, except the thickness of an oxide layer 205" is substantially equal to the thickness of a nitride layer 209".

Figure 4A:
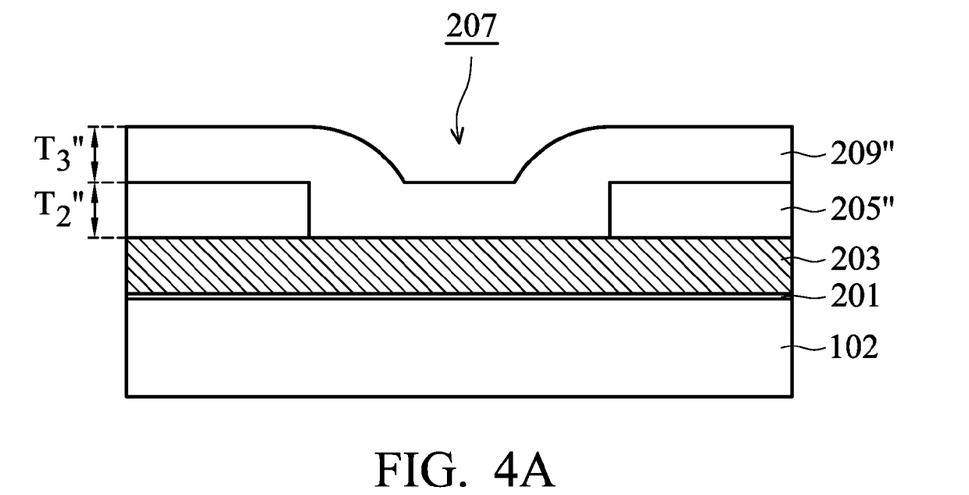
FIGS. 4A to 4E illustrate cross-sectional representations of various stages of forming a flash memory structure with a floating gate having a tip structure in accordance with some embodiments.

More specifically, oxide layer 205" having opening 207 is formed over first polysilicon layer 203, and nitride layer 209" is conformally formed over oxide layer 205", as shown in FIG. 4A in accordance with some embodiments. In addition, oxide layer 205" has a thickness $T_2$", and nitride layer 209" has a thickness $T_3$" substantially equal to thickness $T_2$".

Figure 4B:
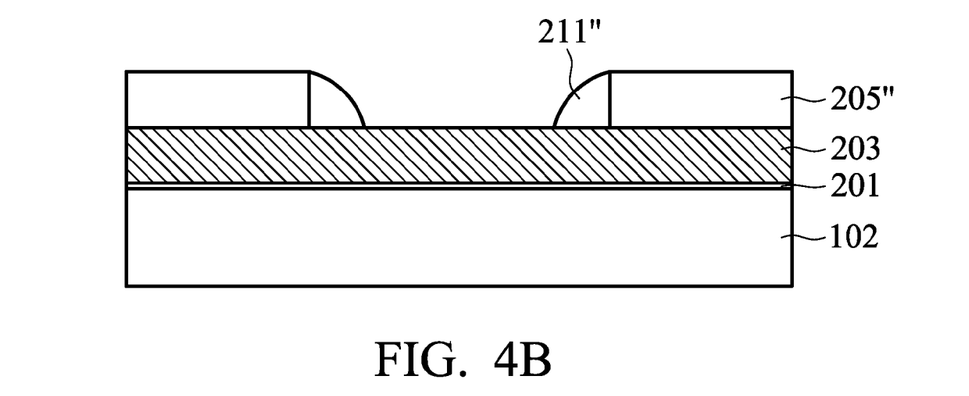
Figure 4C:
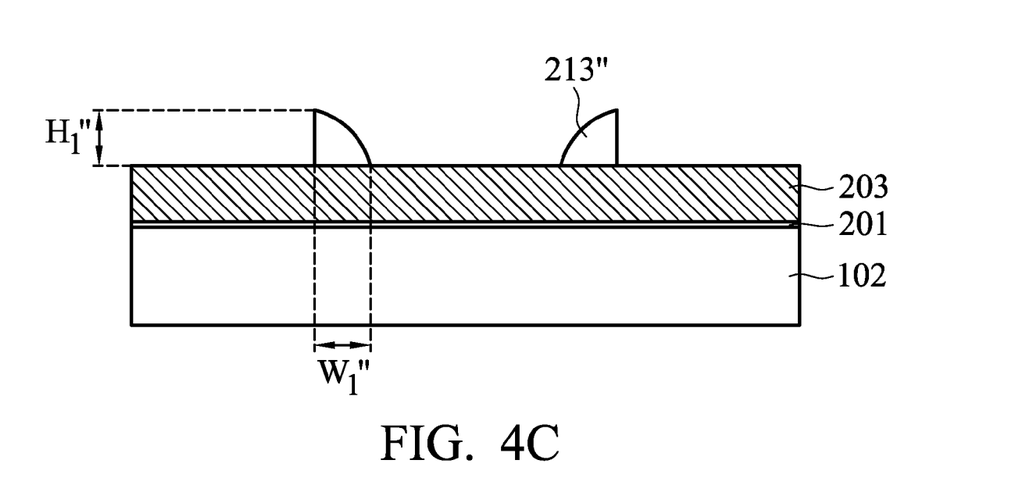

Afterwards, nitride layer 209" is etched to form spacers 211" on the sidewalls of opening 207, as shown in FIG. 4B in accordance with some embodiments. After spacers 211" are formed, oxide layer 205" is removed to form mask structures 213", as shown in FIG. 4C in accordance with some embodiments. In some embodiments, mask structure 213" has a height $H_1$" and a width $W_1$" substantially equal to height $H_1$".

Figure 4D:
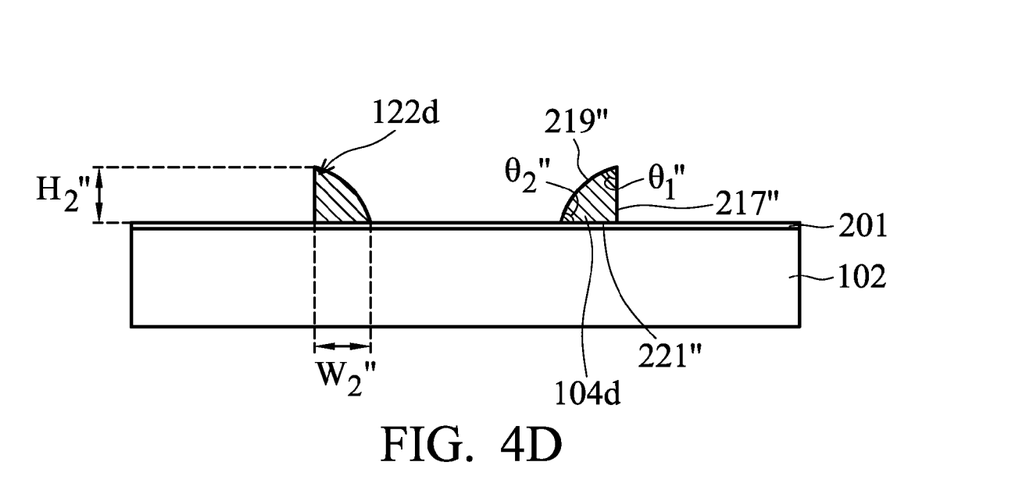

Afterwards, first polysilicon layer 203 is etched to form floating gate 104d, as shown in FIG. 4D in accordance with some embodiments. The shape of floating gate 104d shown in FIG. 4D may be substantially the same as the shape of mask structure 213" shown in FIG. 4C.

In some embodiments, floating gate 104d has a height $H_2$" substantially equal to height $H_1$" of mask structure 213" and a width $W_2$" substantially equal to width $W_1$" of mask structure 213". In some embodiments, height $H_2$" is substantially equal to width $W_2$".

As shown in FIG. 4D, floating gate 104d also has the shape of a shark's fin, and tip structure 112d has an angle $\theta_1$" formed between a first sidewall 217" and a second sidewall 219" of floating gate 104d. In some embodiments, angle $\theta_1$" between first sidewall 217" and second sidewall 219" is in a range from about 30° to about 60°. In some embodiments, an angle $\theta_2$" between second sidewall 219" and bottom surface 221" is in a range from about 30° to about 60°. As shown in FIG. 4D, by adjusting the thickness ratio of oxide layer 205" to nitride layer 209", tip structure 112d of floating gate 104d shown in FIG. 4D may not be as sharp as tip structure 112b of floating gate 104b shown in FIG. 2F but is sharper than tip structure 112c of floating gate 104c shown in FIG. 3D.

Figure 4E:
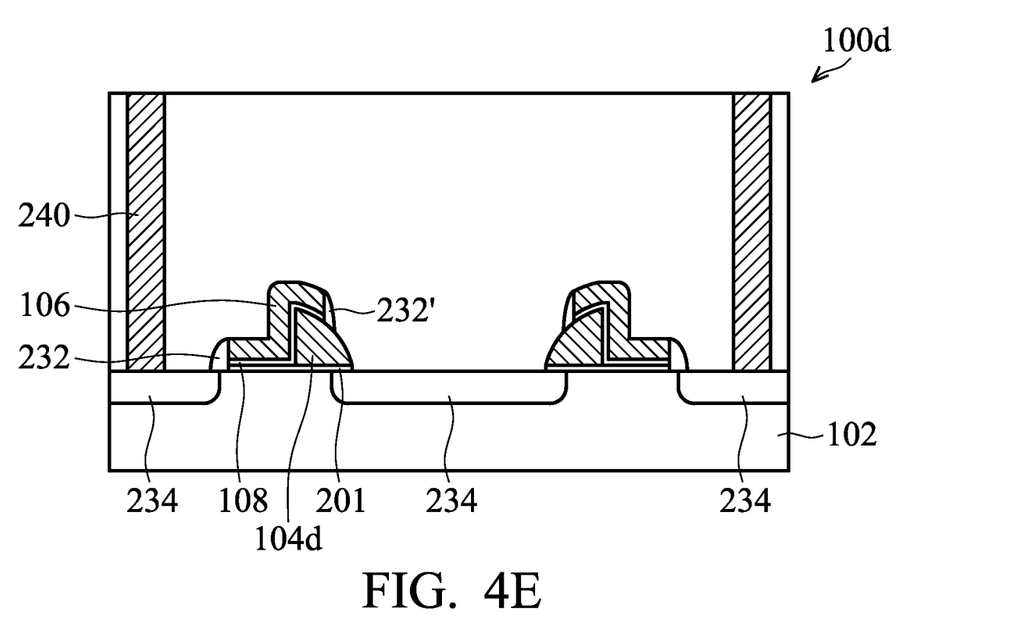

After floating gate 104d is formed, processes similar to those in FIGS. 2G to 2L may be performed to form flash memory structure 100d, as shown in FIG. 4E in accordance with some embodiments. Control gate 106 is formed over substrate 102 and a portion of control gate 106 overlaps with floating gate 104d. In addition, electric charges can be transferred from floating gate 104d to control gate 106 through tip structure 112d.

As described previously, the shape of mask structure 213" can be controlled by thickness $T_2$" of oxide layer 205" and thickness $T_3$" of nitride layer 209". In addition, the shape of floating gate 104d may be similar to, or the same as, the shape of mask structure 213". Therefore, when thickness $T_2$" is substantially equal to thickness $T_3$" (as shown in FIG. 4A), the resulting floating gates 104d may have tip structure 112d sharper than tip structure 112c but not as sharp as tip structure 112b.

As described previously, flash memory structures, such as flash memory structures 100b, 100c, and 100d, are formed without forming poly-oxide structure 110 shown in FIG. 1. Therefore, the oxidation process, which is used to form poly-oxide structure 110, is not performed, and elements formed in/on substrate 102 will not be damaged by the high temperature used in the oxidation process.

In addition, tip structures 112b, 112c, and 112d of floating gates 104b, 104c, and 104d are not defined by poly-oxide structure 110 shown in FIG. 1. Therefore, the profiles of tip structures 112b, 112c, and 112d of floating gates 104b, 104c, and 104d can be controlled as required. For example, when a flash memory structure with a high erasing speed is required, floating gate 104b with the sharp tip structure 112b may be used. On the other hand, when a flash memory structure which has a higher heating tolerance is required, floating gate 104c with the blunt tip structure 112c may be used. Accordingly, floating gates with various profiles may be formed depending on the applications.

Furthermore, the processes used for forming flash memory structures 100b, 100c, and 100d are simpler and easier, and therefore the cost of forming flash memory structures 100b, 100c, and 100d may also decrease.

Embodiments of mechanisms for a flash memory structure are provided. The flash memory structure includes a floating gate, a control gate, and an insulating layer formed between the floating gate and the control gate. The floating gate is formed in a shape like a shark's fin with a tip structure formed between a first sidewall and a second sidewall. The tip structure enables the flash memory structure to have a better performance without using complicated manufacturing processes.

In some embodiments, a semiconductor structure is provided. The semiconductor device structure includes a substrate and a floating gate having a first sidewall and a second sidewall formed over the substrate. The semiconductor device further includes an insulating layer formed over the substrate to cover the first sidewall and an upper portion of the second sidewall of the floating gate. The semiconductor device further includes a control gate formed over the insulating layer. In addition, the floating gate is formed in a shape like a shark's fin.

In some embodiments, a semiconductor structure is provided. The semiconductor device structure includes a substrate and a floating gate having a first sidewall and a second sidewall formed over the substrate. The semiconductor device structure further includes an insulating layer covering the first sidewall and an upper portion of the second sidewall of the floating gate and a control gate formed over the insulating layer. In addition, an angle between the first sidewall and the second sidewall of the floating gate is in a range from about 100 A to about 300 A.

In some embodiments, a method for forming a semiconductor structure is provided. The method for forming the semiconductor structure includes providing a substrate and forming a first polysilicon layer over the substrate. The method further includes forming a mask structure in a shark's fin shape over the first polysilicon layer and etching the first polysilicon layer to form a floating gate by using the mask structure during an etching process. The method further includes forming an insulating layer over the floating gate and forming a second polysilicon layer over the insulating layer. The method also includes patterning the second polysilicon layer to form a control gate. In addition, the floating gate has a shark's fin shape.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a substrate;
a floating gate having a first sidewall and a second sidewall formed over the substrate;
an insulating layer formed over the substrate to cover the first sidewall and an upper portion of the second sidewall of the floating gate;
a control gate formed over the insulating layer;
a first spacer formed on a first sidewall of the control gate over the floating gate, wherein a bottom surface of the first spacer directly contacts the second sidewall of the floating gate; and
a second spacer formed on a second sidewall of the control gate,
wherein the floating gate is formed in a shark's fin shape, and a top surface of the control gate connecting the first sidewall and the second sidewall of the control gate has a step-like profile.

2. The semiconductor structure as claimed in claim 1, wherein an angle between the first sidewall and the second sidewall of the floating gate is in a range from about 30° to about 60°.

3. The semiconductor structure as claimed in claim 1, wherein an angle between the second sidewall and a bottom surface of the floating gate is in a range from about 30° to about 60°.

4. The semiconductor structure as claimed in claim 1, wherein the insulating layer directly contacts the upper portion of the second sidewall of the floating gate.

5. The semiconductor structure as claimed in claim 1, wherein the floating gate has a first height and a first width, and a ratio of the first height to the first width is in a range from about 0.5 to about 2.

6. The semiconductor device structure as claimed in claim 1, wherein the insulating layer has a thickness in a range from about 100 Å to about 300 Å.

7. The semiconductor device structure as claimed in claim 1, wherein the floating gate is a triangle floating gate having a tip structure.

8. The semiconductor device structure as claimed in claim 1, wherein the floating gate has a tip structure.

9. A semiconductor structure, comprising:
a substrate;
a floating gate having a first sidewall and a second sidewall formed over the substrate;
an insulating layer covering the first sidewall and an upper portion of the second sidewall of the floating gate;
a control gate formed over the insulating layer;
a first spacer formed on a first sidewall of the control gate over the floating gate, wherein a bottom surface of the spacer directly contacts the second sidewall of the floating gate; and
a second spacer formed on a second sidewall of the control gate,
wherein an angle between the first sidewall and the second sidewall of the floating gate is in a range from about 30° to about 60°, and a top surface of the control gate connecting the first sidewall and the second sidewall of the control gate has a step-like profile.

10. The semiconductor structure as claimed in claim 9, wherein the floating gate is formed in a shark's fin shape.

11. The semiconductor structure as claimed in claim 9, wherein an angle between the second sidewall and a bottom surface of the floating gate is in a range from about 30° to about 60°.

12. The semiconductor structure as claimed in claim 9, wherein the insulating layer directly contacts the upper portion of the second sidewall of the floating gate.

13. The semiconductor structure as claimed in claim 9, wherein the floating gate has a first height and a first width, and a ratio of the first height to the first width is in a range from about 0.5 to about 2.

14. The semiconductor device structure as claimed in claim 9, wherein the insulating layer has a thickness in a range from about 100 Å to about 300 Å.

15. The semiconductor device structure as claimed in claim 9, wherein the floating gate is a triangle floating gate.

16. The semiconductor device structure as claimed in claim 15, wherein the triangle floating gate has a tip structure.

* * * * *